United States Patent [19]

Itoh

[11] Patent Number: 5,751,634

[45] Date of Patent: May 12, 1998

[54] NON-VOLATILE SEMICONDUCTOR MEMORY DEVICE FOR STORING MULTIVALUE DATA AND READOUT/WRITE-IN METHOD THEREFOR

[75] Inventor: Yasuo Itoh, Kawasaki, Japan

[73] Assignee: Kabushiki Kaisha Toshiba, Kawasaki, Japan

[21] Appl. No.: 647,629

[22] Filed: May 15, 1996

[30] Foreign Application Priority Data

May 16, 1995 [JP] Japan .................................. 7-116676

[51] Int. Cl.$^6$ ................................................ G11C 7/00
[52] U.S. Cl. .................. 365/185.17; 365/185.18; 365/185.2; 365/185.24
[58] Field of Search .................. 365/185.17, 185.18, 365/185.2, 185.24

[56] References Cited

U.S. PATENT DOCUMENTS 5,088,060  2/1992  Endoh et al. .................. 365/185.17
5,379,256  1/1995  Tanaka et al. .................. 365/185.17
5,477,495  12/1995  Tanaka et al. .................. 365/185.17

FOREIGN PATENT DOCUMENTS

7-37393  2/1995  Japan .

*Primary Examiner*—David C. Nelms
*Assistant Examiner*—Michael T. Tran
*Attorney, Agent, or Firm*—Banner & Witcoff, Ltd.

[57] ABSTRACT

Memory cells each for storing 2-bit data are connected to a bit line. First and second flip-flop circuits are coupled to the bit line. The first flip-flop circuit holds the lower bit of 2-bit data read out from or written into the memory cell and the second flip-flop circuit holds the upper bit of 2-bit data read out from or written into the memory cell. At the data readout time, the upper bit is first read out from the memory cell and then the lower bit is read out from the memory cell. At the data writing time, the upper bit is first written into the memory cell and then the lower bit is written into the memory cell.

40 Claims, 9 Drawing Sheets

| | READOUT | ERASE | WRITE |
|---|---|---|---|
| BL | PRECHARGED TO 5V | OPEN | "0" WRITE : 0V<br>"1" WRITE : 9V |
| SL1 | 5V | 0V | 11V |
| WL | SELECTED : 0V<br>NON-SELECTED : 5V | 0V | SELECTED : 18V<br>NON-SELECTED : 9V |
| SL2 | 5V | 0V | 0V |
| W | 0V | 18V | 0V |
| S | 0V | 18V | 0V |

F I G. 12

F I G. 13A

F I G. 13B

F I G. 13C

| | $\overline{MSB}$ | LSB | POTENTIAL OF AM OF MSEN AFTER READOUT | BIT LINE POTENTIAL AT WRITE TIME |
|---|---|---|---|---|
| STATE 1 | 0 | 1 | Vcc | → VM |
| STATE 2 | 0 | 0 | Vcc | → VM |
| STATE 3 | 1 | 1 | Vcc | → VM |
| STATE 4 | 1 | 0 | 0V | → 0V |

F I G. 10

WRITE INHIBITION

NON-VOLATILE SEMICONDUCTOR MEMORY DEVICE FOR STORING MULTIVALUE DATA AND READOUT/ WRITE-IN METHOD THEREFOR

BACKGROUND OF THE INVENTION

1. Field of the Invention

This invention relates to a non-volatile semiconductor device, and more particularly to a sense amplifier used for writing and reading out multivalue data.

2. Description of the Related Art

Recently, the demand for non-volatile semiconductor memory devices is significantly increased since they have an advantage that data will not be cleared even when the power supply switch is turned OFF. Unlike a byte type non-volatile semiconductor memory device using two transistors, a flash memory used as a non-volatile semiconductor memory device in which data can be simultaneously electrically erased has memory cells each of which can be constructed by one transistor and the size of the memory cell can be made small. Therefore, the flash memory is expected to be used instead of a magnetic disk of large storage capacity, for example.

Figure 11A:
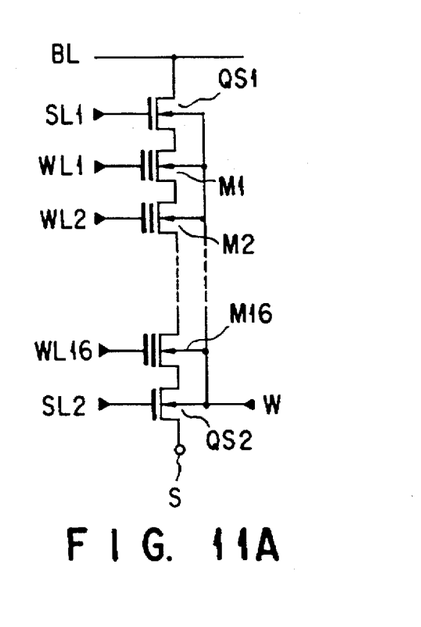
FIG. 11A is a circuit diagram showing the cell construction of a NAND type flash memory.

FIG. 11A shows a NAND type flash memory used as a non-volatile semiconductor memory device. In FIG. 11A, memory cells M1 to M16 constructed by MOS transistors having floating gates are serially connected. One end of the memory cell row is connected to a bit line BL via a selection transistor QS1 and the other end thereof is connected to a common source line S via a selection transistor QS2. The transistors are formed on the same well W. The control electrodes of the memory cells M1 to M16 are respectively connected to word lines WL1 to WL16, the control electrode of the selection transistor QS1 is connected to a selection line SL1, and the control electrode of the selection transistor QS2 is connected to a selection line SL2.

Each of the memory cells M1 to M16 has a threshold voltage corresponding to data held therein. The threshold voltage is set in a range of 0 V to 5 V when data "0" is held in the memory cell, and is set at 0 V or less when data "1" is held. Since the threshold voltage has a certain degree of margin, it is suitably set to values slightly smaller than the above values.

Figure 11B:
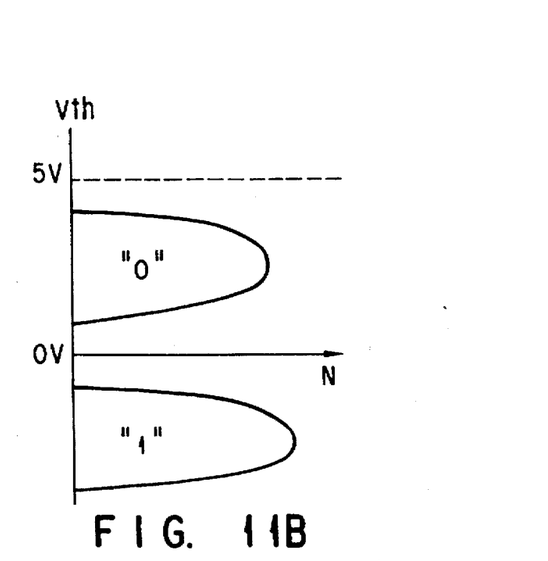
FIG. 11B is a diagram showing the distribution of the threshold voltages of memory cells shown in FIG. 11A.
Figure 12:
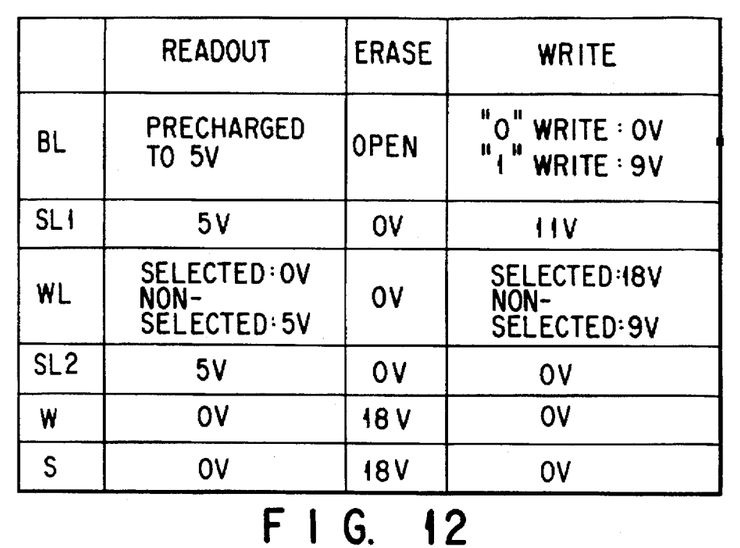
FIG. 12 is a diagram for illustrating the operation of the memory cells shown in FIG. 11A.

The distribution of the threshold values of the memory cells is obtained as shown in FIG. 11B. FIG. 12 shows voltages applied to respective portions of the memory cells at the time of readout, erase and write operations. In the readout operation, the bit line BL is first precharged to 5 V and then set into an electrically floating state. After this, 5 V is applied to the selection line SL1, 0 V is applied to the word line WL of the selected memory cell, 5 V is applied to the word line WL of the non-selected memory cell, 5 V is applied to the selection line SL2, 0 V is applied to the well W, and 0 V is applied to the common source line S. Then, all of the transistors (including non-selected memory cells) other than the selected memory cells are turned ON. When data "0" is held in the selected memory cell, the memory cell is rendered non-conductive and the potential of the bit line is kept at 5 V and unchanged. However, when data "1" is held in the selected memory cell, the memory cell is rendered conductive so that the bit line will be discharged and the potential thereof will be lowered. Data can be detected by detecting the potential of the bit line.

Figure 13A:
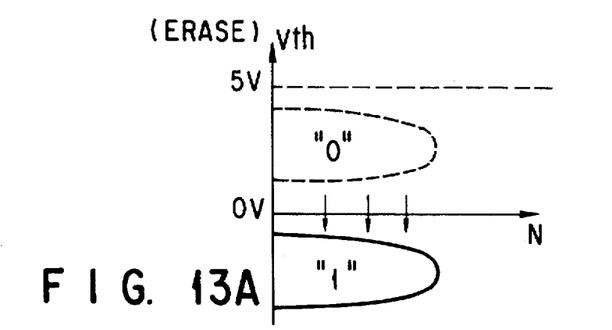
FIGS. 13A to 13C are diagrams for illustrating the erase and write operations.

In the erase operation, the bit line BL is set in an electrically floating state, 0 V is applied to the selection line SL1, 0 V is applied to the word lines WL of the memory cells, 0 V is applied to the selection line SL2, 18 V is applied to the well W, and 18 V is applied to the common source line S. Then, a tunnel current flows through the gate insulation film between the floating gate and the well, and the threshold voltages of the memory cells are lowered to 0 V or less (FIG. 13A).

Figure 13B:
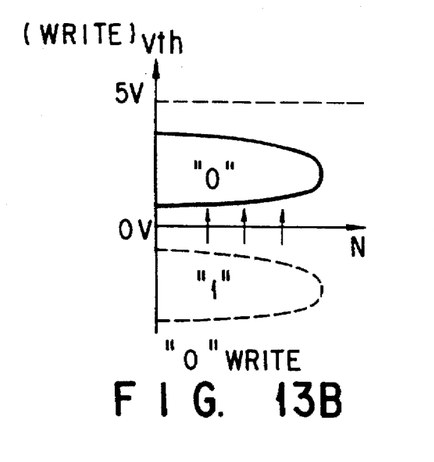
Figure 13C:
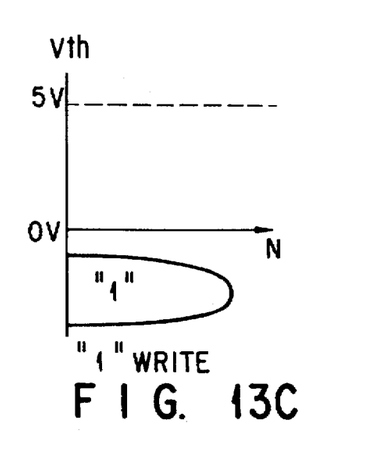

In the write operation, a voltage which is set to different values according to data to be written is applied to the memory cell. That is, when data "0" is written to shift the threshold voltage, 0 V is applied to the bit line BL, and when data "1" is written so as not to shift the threshold voltage, 9 V is applied to the bit line BL. At this time, 11 V is applied to the selection line SL1, 18 V is applied to the word line WL of the selected memory cell, 9 V is applied to the word line WL of the non-selected memory cell, 0 V is applied to the selection line SL2, 0 V is applied to the well W, and 0 V is applied to the common source line. As a result, all of the transistors ranging from the selection transistor QS1 to the memory cell M16 are rendered conductive and the source potentials thereof are set to the same potential as that of the bit line. In this case, it is not taken into consideration that the potential is lowered by an amount corresponding to the threshold voltage of the transistor. When 0 V is applied to the bit line BL, a voltage between the channel and the control electrode of the memory cell becomes 18 V, thereby causing a tunnel current to flow and causing the threshold voltage to be shifted in a positive direction (FIG. 13B). On the other hand, when 9 V is applied to the bit line BL, a voltage between the channel and the control electrode of the memory cell becomes 9 V, thereby preventing flow of the tunnel current and suppressing the shifting of the threshold voltage in the positive direction (FIG. 13C).

Figure 14:
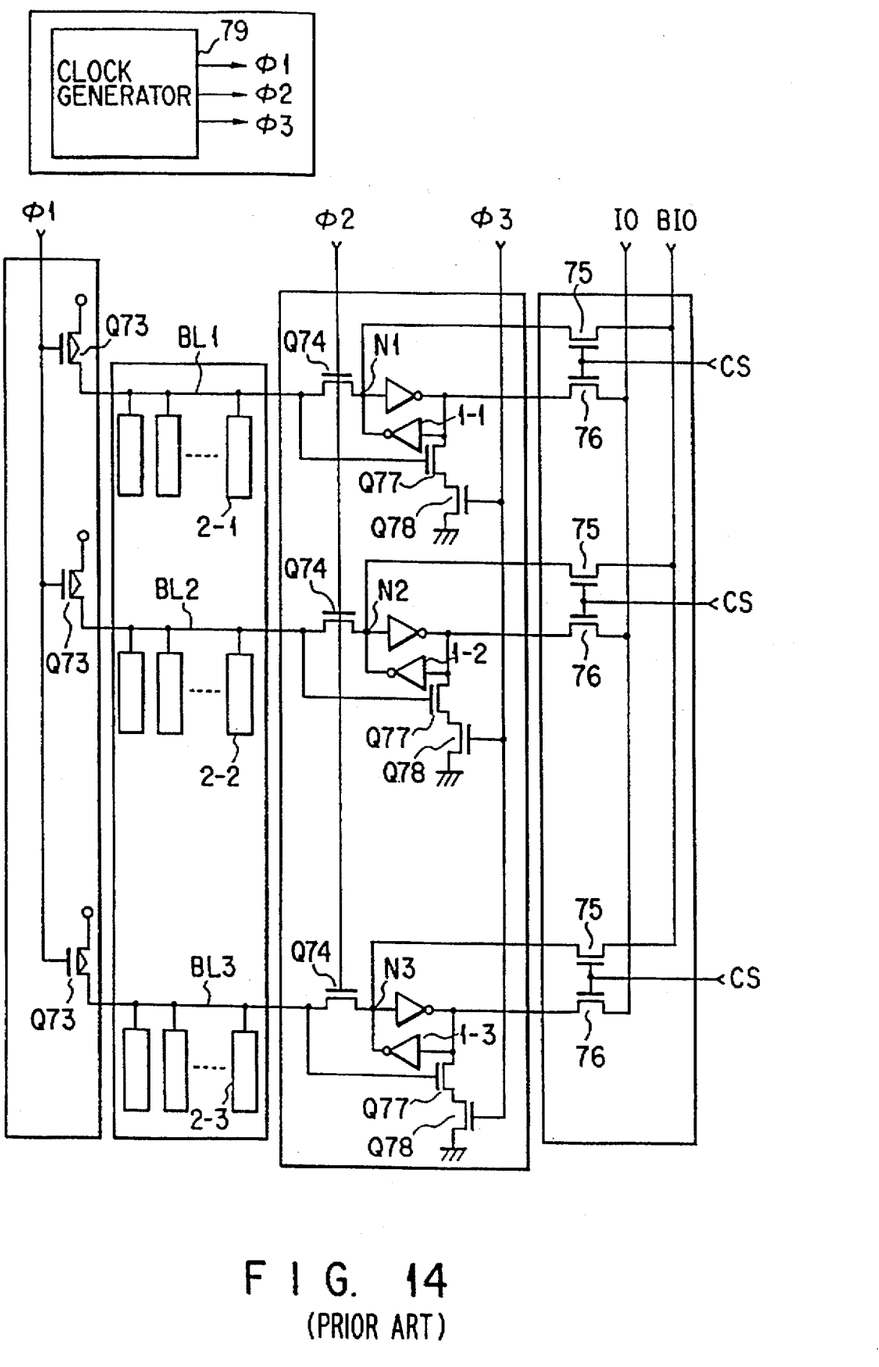
FIG. 14 is a diagram showing the main portion of a conventional semiconductor memory device.

FIG. 14 is a circuit diagram showing the main portion of a conventional non-volatile semiconductor memory device in which three of the bit lines are shown.

In FIG. 14, a circuit for one bit line is constructed as follows. The circuit section includes flip-flop circuits 1-x (x=1 to 3) for temporarily holding write data. NAND type memory cells 2-x (x=1 to 3) are connected to corresponding bit lines BLx (x=1 to 3). P-channel MOS transistors Q73 are used to precharge the respective bit lines BLx in response to a signal $\phi1$. MOS transistors Q74 are used to electrically connect the bit lines BLx to the corresponding flip-flop circuits 1-x in response to a signal $\phi2$. Series circuits of MOS transistors Q77, Q78 are connected between the nodes of the respective flip-flop circuits 1-x lying on the opposite sides of the nodes thereof which are connected to the corresponding bit lines BLx and the ground node. The transistors Q77, Q78 construct forced inverting means. The gates of the transistors Q77 are connected to the corresponding bit lines BLx and the gates of the transistors Q78 are supplied with a signal $\phi3$. Both nodes of the flip-flop circuit 1-x are connected to input/output lines BIO, IO via transfer transistors 75, 76 which are controlled by a column selection signal CS.

A clock generating circuit 79 generates the signals $\phi1$, $\phi2$, $\phi3$ at preset timings.

The sources of the transistors Q73 are connected to a power supply (not shown) whose output voltage is set to 9 V in the write operation mode and 5 V in the other operation mode. Further, the output voltage of a power supply (not shown) of the flip-flop circuits is set to 9 V in the write operation mode and 5 V in the other operation mode.

The above semiconductor memory device is a one-cell/ one-bit storage system for storing one bit in one cell. The cost for one bit of the semiconductor memory device is almost ten times that of the magnetic disk, and if a memory corresponding in storage capacity to the disk is constructed by use of the semiconductor memory device of one-cell/one-bit storage system, the cost becomes high.

Therefore, a method for reducing the size of the memory cell and enhancing the integration density is considered. However, in order to realize the above method, large-scale equipment investment is necessary and it takes a long time to newly develop the technique.

SUMMARY OF THE INVENTION

An object of this invention is to provide a non-volatile semiconductor memory device of large capacity with low cost without using the highly fine patterning technique and new manufacturing technique.

The above object can be attained by a non-volatile semiconductor memory device comprising memory cells connected to bit lines, first and second data items being stored in each of the memory cells; a voltage generating circuit for generating a plurality of reference voltages of different levels and supplying the reference voltage to the gates of the memory cells at the data writing and data readout time; and first and second storage circuits coupled to the bit lines, for holding first and second data to be written into the memory cell at the data writing time and holding first and second data read out from the memory cell according to the plurality of reference voltages at the data readout time.

According to this invention, the first and second storage circuits are coupled to the bit lines, and data read out from the memory cell is held in the first and second storage circuits by changing the reference voltage supplied to the gate of the memory cell in the data readout mode. Further, multivalue data is written into the memory cell by writing data held in the first and second storage circuits into the memory cell and setting the threshold voltage of the memory cell according to data held in the first and second storage circuits by changing the reference voltage supplied to the gate of the memory cell. Therefore, it becomes possible to construct a non-volatile semiconductor memory device of large capacity. Further, since the non-volatile semiconductor memory device can be formed by use of the same manufacturing process as the normal manufacturing process, an increase in the manufacturing cost can be suppressed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

There will now be described an embodiment of this invention with reference to the accompanying drawings.

Figure 1:
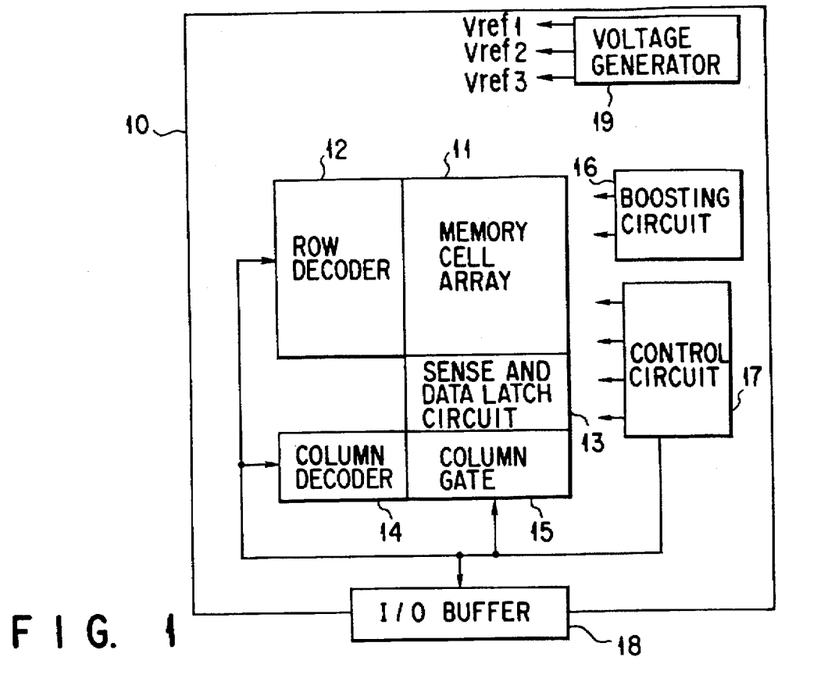
FIG. 1 is a construction diagram showing a non-volatile semiconductor memory device of this invention.

FIG. 1 is a block diagram showing the whole circuit construction of a non-volatile semiconductor memory device according to a first embodiment of this invention. The first embodiment is an example of a NAND type flash memory. That is, a non-volatile semiconductor memory device 10 includes a memory cell array 11, row decoder 12, sense circuit and write data latch 13, column decoder 14, column gate 15, boosting circuit 16, control circuit 17, and I/O buffer 18.

Like the circuit shown in FIG. 11A, the memory cell array 11 has a plurality of NAND type memory cells arranged in a matrix form, and several thousands of bit lines BL are arranged in the column direction and several thousands of word lines WL are arranged in the row direction. The row decoder 12 selects one of the word lines according to an address input from the exterior. The sense circuit and write data latch 13 is connected between the memory cell array 11 and the column gate 15 and connected to the I/O buffer 18 via the column gate 15. The column decoder 14 is connected to the column gate 15 and controls the column gate 15 according to an address input from the exterior to select a bit line and a corresponding sense circuit and write data latch 13. The boosting circuit 16 supplies a high voltage necessary for the write operation and erase operation. The control circuit 17 controls various operations such as the erase and readout operations. A voltage generating circuit 19 generates reference voltages Vref1 to Vref3 required when multivalue data is read out from the memory cell or when multivalue data is written into the memory cell. The reference voltages Vref1 to Vref3 generated from the voltage generating circuit 19 are supplied to the sense and data latch circuit 13. The I/O buffer 18 provides the interface with the exterior of the chip.

Figure 2:
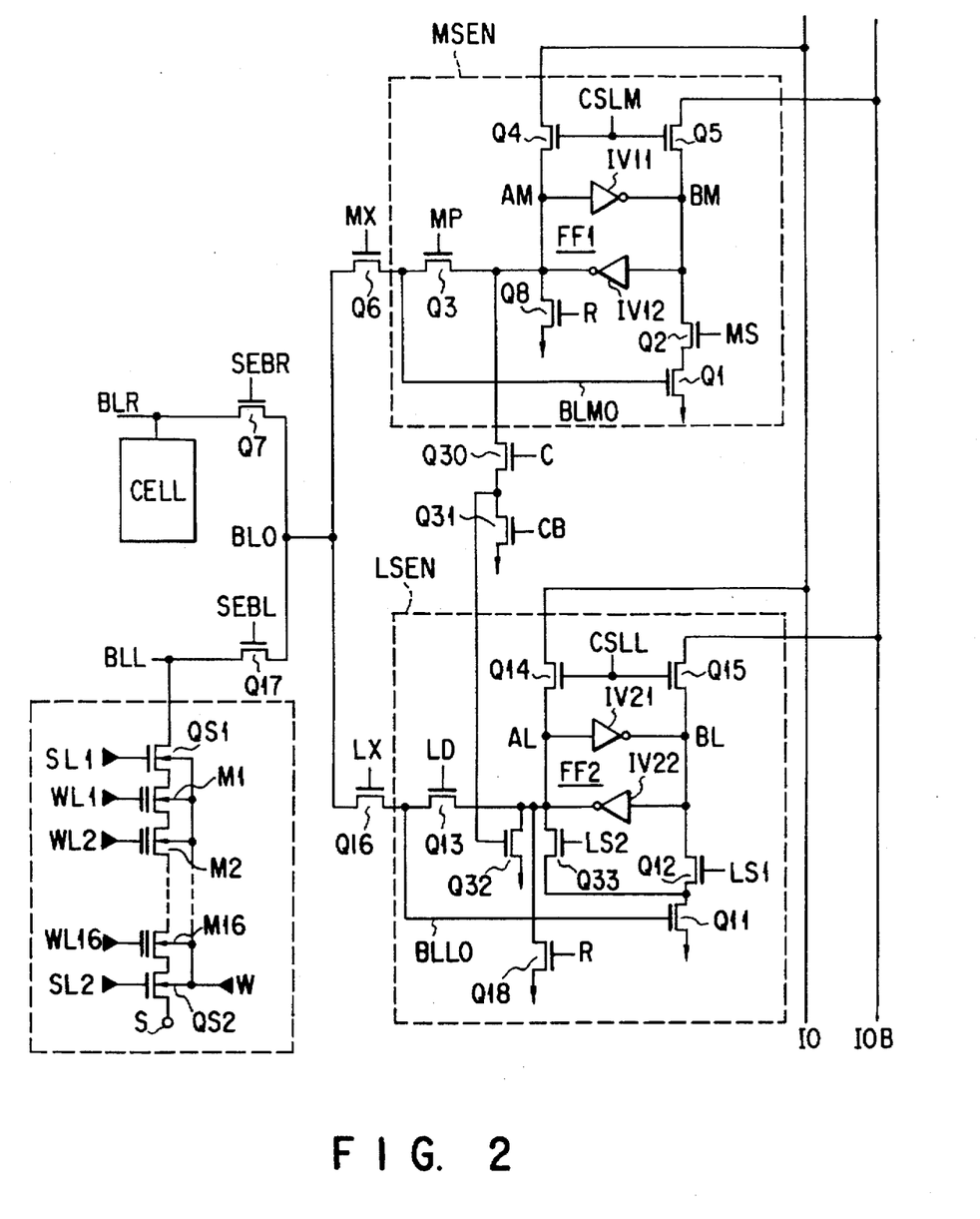
FIG. 2 is a circuit diagram showing the main portion shown in FIG. 1.

FIG. 2 is a circuit diagram showing the main portion of a non-volatile semiconductor memory device of this invention and concretely shows the sense and data latch circuit 13 of FIG. 1.

As shown in FIG. 2, memory cells constructed by NAND cells, for example, are connected to paired bit lines .BLR, BLL. In FIG. 2, the word lines are omitted. In one memory cell constructing the NAND cell, 2-bit data is stored, for example. The paired bit lines BLR, BLL are connected to a node BLO via transistors Q7, Q17, respectively. Selection signals SEBR, SEBL are supplied to the gates of the transistors Q7, Q17 and one of the bit lines is selected according to the selection signals SEBR, SEBL. The selected bit line is electrically connected to two sense amplifiers MSEN, LSEN. The sense amplifier MSEN is used to read out or write the most significant bit (MSB) of the 2-bit data, and the sense amplifier LSEN is used to read out or write the least significant bit (LSB) of the 2-bit data.

The node BLO is connected to the sense amplifiers MSEN, LSEN via transistors Q6, Q16, respectively. Selection signals MX, LX are supplied to the gates of the transistors Q6, Q16. In the sense amplifier MSEN, one end of the current path of a transistor Q3 is connected to the current path of the transistor Q6 and the other end thereof is grounded via a reset transistor Q8. A signal MP is supplied to the gate of the transistor Q3 and a signal R is supplied to the gate of the transistor Q8. Further, the other end of the current path of the transistor Q3 is connected to the input terminal of an inverter circuit IV11 constructing a flip-flop circuit FF1 and the output terminal of an inverter circuit IV12. The output terminal of the inverter circuit IV11 and the input terminal of the inverter circuit IV12 are grounded via a series circuit of transistors Q2 and Q1. A signal MS is supplied to the gate of the transistor Q2 and a signal output from a connection node BLMO between the transistors Q6 and Q3 is supplied to the gate of the transistor Q1. Further, a node AM acting as the input terminal of the inverter circuit IV11 and the output terminal of the inverter circuit IV12 is connected to an input/output line IO via a transfer transistor Q4, and a node BM acting as the output terminal of the inverter circuit IV11 and the input terminal of the inverter circuit IV12 is connected to an input/output line IOB via a transfer transistor Q5. The input/output lines IO and IOB transmit complementary signals. A column selection signal CSLM is supplied to the gates of the transistors Q4, Q5.

In the sense amplifier LSEN, one end of the current path of a transistor Q13 is connected to the current path of the transistor Q16 and the other end thereof is grounded via a reset transistor Q18. A signal LD is supplied to the gate of the transistor Q13 and a signal R is supplied to the gate of the transistor Q18. Further, the other end of the current path of the transistor Q13 is connected to the input terminal of an inverter circuit IV21 constructing a flip-flop circuit FF2 and the output terminal of an inverter circuit IV22. The output terminal of the inverter circuit IV21 and the input terminal of the inverter circuit IV22 are grounded via a series circuit of transistors Q12 and Q11. A signal LSI is supplied to the gate of the transistor Q12 and a signal output from a connection node BLLO between the transistors Q16 and Q13 is supplied to the gate of the transistor Q11. Further, a node AL acting as the input terminal of the inverter circuit IV21 and the output terminal of the inverter circuit IV22 is connected to the input/output line IO via a transfer transistor Q14, and a node BL acting as the output terminal of the inverter circuit IV21 and the input terminal of the inverter circuit IV22 is connected to the input/output line IOB via a transfer transistor Q15. A column selection signal CSLL is supplied to the gates of the transistors Q14, Q15.

A series circuit of transistors Q30 and Q31 is connected between the other end of the current path of the transistor Q3 and the ground node. Signals C and CB are respectively supplied to the gates of the transistors Q30 and Q31. Further, a transistor Q32 is connected between the other end of the current path of the transistor Q13 and the ground node. The gate of the transistor Q32 is connected to a connection node between the transistors Q30 and Q31.

The operation of the circuit with the above construction shown in FIG. 2 is explained. For example, assume a case wherein the bit line BLR is selected, the bit line BLL is not selected, and data is read out from the memory cell connected to the bit line BLR. At this time, the selection signal SEBR is set at a high level, the transistor Q7 is set in the ON state, the selection signal SEBL is set at a low level, and the transistor Q17 is set in the OFF state. The readout operation is effected by the three-stage method described as follows.

(1) MSB is read out by use of the sense amplifier MSEN provided for reading out MSB.

(2) LSB is read out by use of the sense amplifier LSEN when MSB=1.

(3) LSB is read out by use of the sense amplifier LSEN when MSB=0.

MSB data thus sensed from the memory cell is latched in the sense amplifier MSEN, and LSB data is latched in the sense amplifier LSEN. Next, a method for reading out 2-bit data (four states) is explained with reference to FIGS. 2, 3 and 7.

Figure 7:
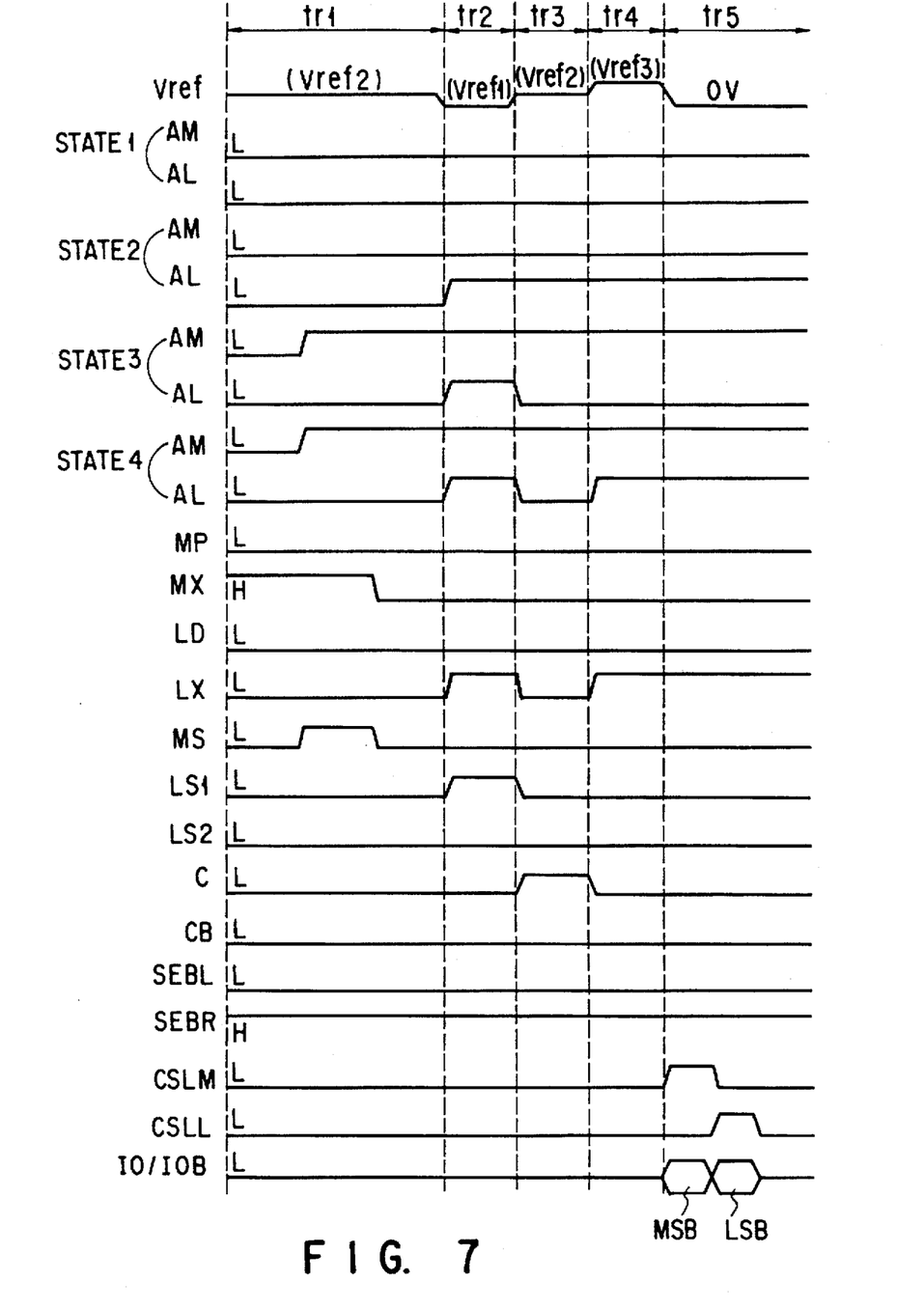
FIG. 7 is a timing chart for illustrating the readout operation of the non-volatile semiconductor memory device of this invention.

(1) MSB readout (sensing) operation (period tr1 shown in FIG. 7)

Figure 3:
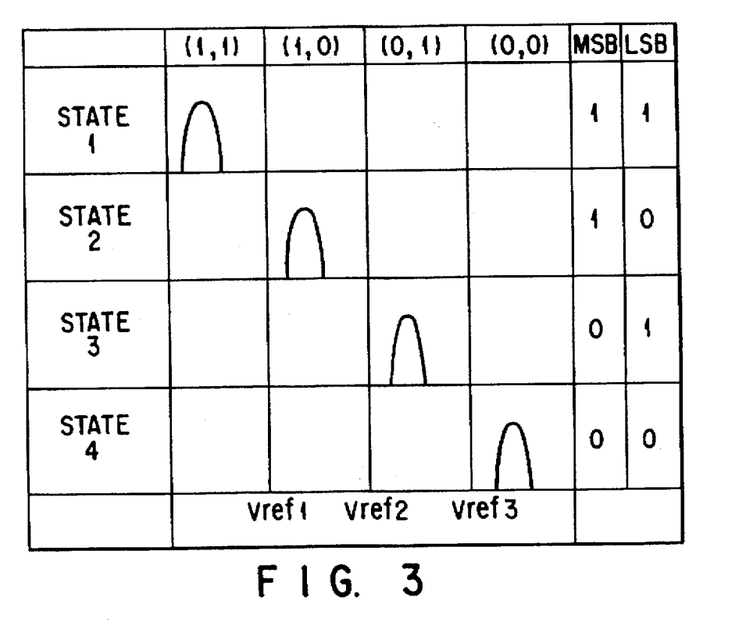
FIG. 3 is a diagram showing the distribution of the threshold voltages of memory cells storing 2-bit (4-value) data.

First, the reference voltage Vref2 (for example, 1.0 V) is applied to the control gate of the selected memory cell. In the state 1 in which the memory cell stores data (1, 1) and in the state 2 in which the memory cell stores data (1, 0), the threshold voltage of the memory cell is lower than the reference voltage Vref2. Therefore, a current flows in the memory cell, thereby causing the potentials of the bit line BLR, nodes BLO and BLMO to be set to 0 V so that the transistor Q1 will be set in the OFF state and the potential of the node AM will be kept at 0 V. As a result, data "1" is latched in the flip-flop circuit FF1.

On the other hand, in the state 3 in which the memory cell stores data (0, 1) and in the state 4 in which the memory cell stores data (0, 0), the threshold voltage of the memory cell is higher than the reference voltage Vref2. Therefore, no current flows in the memory cell, thereby causing the potentials of the bit line BLR, nodes BLO and BLMO to be set to a high level, for example, a power supply voltage Vcc so that the transistor Q1 may be set in the ON state. At this time, since the signal MS is also set at a high level, the transistor Q2 is turned ON, the potential of the node BM is changed from Vcc to the ground potential Vss, the potential of the node AM is changed from Vss to Vcc, and data "0" is latched in the flip-flop circuit FF1. In this case, the transistors Q8, Q18 are turned ON by the signal R before the readout operation is started, and the nodes AM, AL are precharged to the low potential level and the nodes BM, BL are precharged to the high potential level.

(2) LSB sensing operation (period tr2 shown in FIG. 7) in the case of MSB=1

As described above, in the sense amplifier LSEN, the node BL is precharged to the high potential level and the node AL is precharged to the low potential level before the readout operation is started.

(2-1) Sense operation in the case of MSB=1 and LSB=1 (state 1).

The potential of the control gate of the memory cell is set to the reference voltage Vref1, for example, 0 V. In the state 1, since the threshold voltage of the memory cell is lower than the reference voltage Vref1, a cell current flows and the potentials of the bit line BLR and nodes BLO and BLLO are set to 0 V. As a result, the transistor Q11 is turned OFF and the potential of the node AL is kept at 0 V. Therefore, data "1" is latched in the flip-flop circuit FF2.

(2-2) Sense operation in the case of MSB=1 and LSB=0 (state 2).

The potential of the control gate of the memory cell is set to the reference voltage Vref1, for example, 0 V. In the state 2, since the threshold voltage of the memory cell is higher than the reference voltage Vref1, no cell current flows and the potentials of the bit line BLL and nodes BLO and BLLO are set to the high level, and the transistor Q11 is turned ON. At this time, since the signal LS1 is also set at the high level, the transistor Q12 is turned ON and the node BL is discharged. Therefore, the potential of the node AL is changed from Vss to Vcc and data "0" is latched in the flip-flop circuit FF2.

Thus, the LSB sensing operation at the time of MSB=1 is effected as indicated by the above processes (2-1), (2-2).

In the case of NAND cell, a plurality of memory cells are connected to a selected word line in the readout operation. If data stored in the memory cell is set in the state 3 or state 4, data "0" is latched in the sense amplifier MSEN. If, in this state, LSB data is read out from the memory cell set in the state 3 or state 4 with the reference voltage set at Vref1, LSBs in both of the state 3 and state 4 become data "0" and thus data cannot be correctly read out. Therefore, it becomes necessary to inhibit the readout operation of the memory cell in the state 3 or state 4 when LSB of the memory cell in which MSB=1 is read out.

(2-3) Sense inhibiting operation in the case of MSB=0 and LSB=1 (state 3).

The potential of the control gate of the memory cell is set to the reference voltage Vref1, for example, 0 V. In the state 3, since the threshold voltage of the memory cell is higher than the reference voltage Vref1, no cell current flows and the potentials of the bit line BLR and nodes BLO and BLLO are set to the high level so that the transistor Q11 will be turned ON. At this time, since the signal LS1 is also set at the high level, the transistor Q12 is turned ON and the node BL is discharged. Therefore, the potential of the node AL is set to the high level=Vcc and the potential is temporarily latched in the flip-flop circuit FF2. However, since the signal C is set at the high level (higher than (Vcc+Vth)) and the signal CB is set at 0 V, the transistor Q30 is turned ON and data on the node AM is transmitted to the node AL. That is, when the potential of the node AM is Vcc (MSB=0), the transistor Q32 is turned ON, the node AL is discharged and the potential of the node BL is set to the high level. Therefore, the flip-flop circuit FF2 is reset to the precharge state set before the readout operation.

(2-4) Sense inhibiting operation in the case of MSB=0 and LSB=0 (state 4).

The transistor Q32 is turned ON by the potential of the node AM according to the same operation as in the case of the process (2-3), the node AL is discharged and the potential of the node BL is set to the high level. Therefore, the flip-flop circuit FF2 is reset to the precharge state set before the readout operation.

As described above, by the operation of the process (2-3) (state 3) or (2-4) (state 4), the LSB sensing operation for the memory cell in which MSB=0 is inhibited and the precharge state can be restored.

(3) LSB readout operation (period tr5 shown in FIG. 7) in the case of MSB=0

In the readout mode, the signals C, CB are set to the low level and the transistors Q30, Q32 are set in the OFF state.

(3-1) Sense operation in the case of MSB=0 and LSB=1 (state 3).

The potential of the control gate of the memory cell is set to the reference voltage Vref3, for example, 2 V. In the state 3, since the threshold voltage of the memory cell is lower than the reference voltage Vref3, a current flows in the memory cell and the potentials of the bit line BLR and nodes BLO and BLLO are set to 0 V. As a result, the transistor Q11 is turned OFF and the potential of the node AL is kept at 0 V. Therefore, data "1" is latched in the flip-flop circuit FF2.

(3-2) Sense operation in the case of MSB=0 and LSB=0 (state 4).

The potential of the control gate of the memory cell is set to the reference voltage Vref3, for example, 2 V. In the state 4, since the threshold voltage of the memory cell is higher than the reference voltage Vref3, no current flows in the memory cell and the potentials of the bit line BLR and nodes BLO and BLLO are set to the high level. As a result, the transistor Q11 is turned ON, and at this time, since the signal LS1 is also set at the high level, the transistors Q12, Q11 are turned ON. Therefore, the node BL is discharged, the potential of the node AL is set to the high level and data "0" is latched in the flip-flop circuit FF2.

In the case of NAND cell, a plurality of memory cells are connected to a selected word in the readout operation. If data stored in the memory cell is set in the state 1 or state 2 and when LSB data is read out from the memory cell with the reference voltage set at Vref3, LSBs in both of the state 1 and state 2 become data "1" and thus data cannot be correctly read out. Therefore, it becomes necessary to inhibit the readout operation of the memory cell in the state 1 or state 2 when LSB of the memory cell in which MSB=1 is read out.

(3-3) Non-sense operation in the case of MSB=1 and LSB=1 (state 1).

The potential of the control gate of the memory cell is set to the reference voltage Vref3, for example, 2 V. In the state 1, since the threshold voltage of the memory cell is lower than the reference voltage Vref3, a current flows in the memory cell and the potentials of the bit line BLR and nodes BLO and BLLO are set to 0 V. As a result, the transistor Q11 is not turned ON and the flip-flop circuit FF2 holds the state set after the sense operation explained in the process (2-1).

(3-4) Non-sense operation in the case of MSB=1 and LSB=0 (state 2).

The transistor Q11 is not turned ON for the same reason as explained in the process (3-4) and the state set after the sense operation and explained in the process (2-2) is held.

By the three-stage sense operations based on the above processes (1), (2) and (3), MSB data is latched in the sense amplifier MSEN and LSB data is latched in the sense amplifier LSEN. After this, as indicated by the period tr5 shown in FIG. 7, the column selection signals CSLM, CSLL are sequentially set to the high level and data items latched in the sense amplifiers MSEN, LSEN are sequentially output to the input/output lines IO, IOB.

(4) Erase and write operation (4-1) Erase operation

Data stored in the memory cells are simultaneously erased by the same method as the conventional method. The threshold voltage after the simultaneous erasing is set to the state 1, that is, the memory cells subjected to the erase operation are set to the state in which MSB=1 and LSB=1 are stored.

Next, a case wherein data is written into the memory cell is explained with reference to FIGS. 2, 4, 5, 6, 8, 9 and 10. The write operation is effected in the following order.

Figure 8:
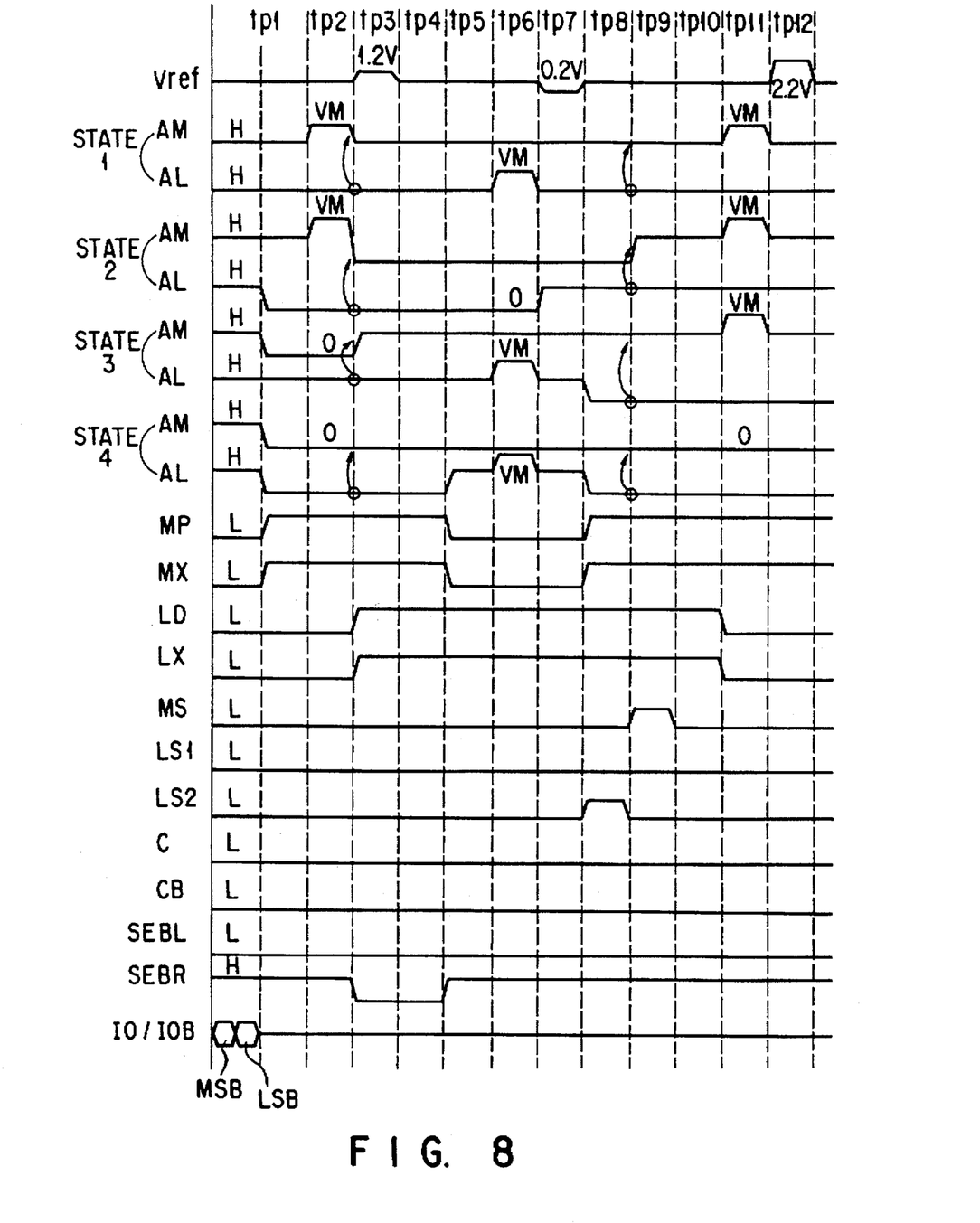
FIG. 8 is a timing chart for illustrating the write operation of the non-volatile semiconductor memory device of this invention.

(4-2-1) Latch operation of write data (period tp1 shown in FIG. 8)

Data to be written is latched into the sense amplifiers MSEN, LSEN via the input/output lines IO, IOB and the transfer transistors Q4, Q5, Q14, Q15. That is, MSB data is latched in the sense amplifier MSEN and LSB data is latched in the sense amplifier LSEN.

(4-2-2) Write operation of MSB data (period tp2 shown in FIG. 8) and verify operation (period tp3 shown in FIG. 8)

Figure 4:
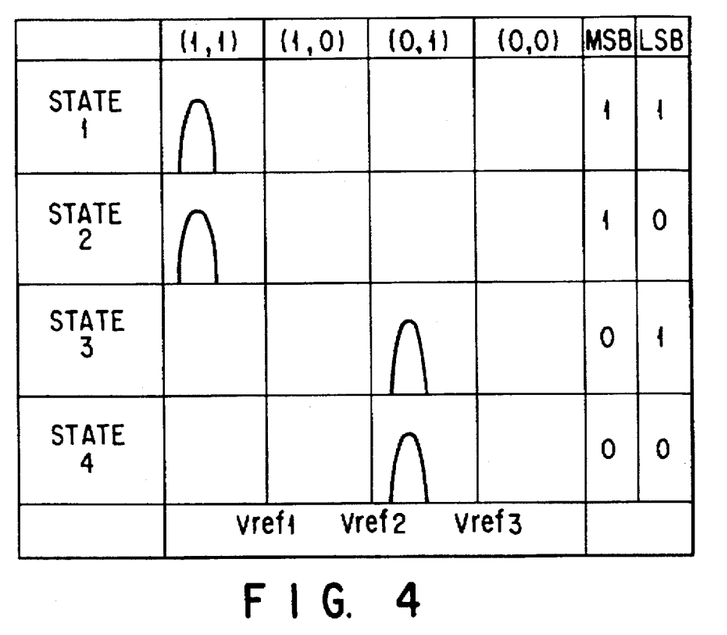
FIG. 4 is a diagram showing the distribution of the threshold voltages of memory cells after the MSB data writing operation is effected.

MSB data latched in the sense amplifier MSEN is transferred to the bit line BLR by turning ON the transistors Q3, Q6, Q7 of FIG. 2. When the potential of the bit line BLR is set at the high level, data "1" is written into the selected memory cell and the memory cell comes to be a depletion type. Further, when the potential of the bit line BLR is set at the low level, electrons are injected into the floating gate of the selected memory cell and the memory cell comes to be an enhancement type. The threshold voltage of the memory cell after the write operation is set as shown in FIG. 4.

The verify operation of MSB data can be effected by the same method as the MSB readout method explained in the process (2-1). However, in this case, the reference voltage Vref2 used as the verify potential has a margin of 0.2 V, for example, and is set to 1.2 V. If the verify operation is not completed, the write operation and verify operation are repeatedly effected until MSB data is correctly written.

(4-2-3) Write operation of LSB=0 in the case of MSB=1

Figure 5:
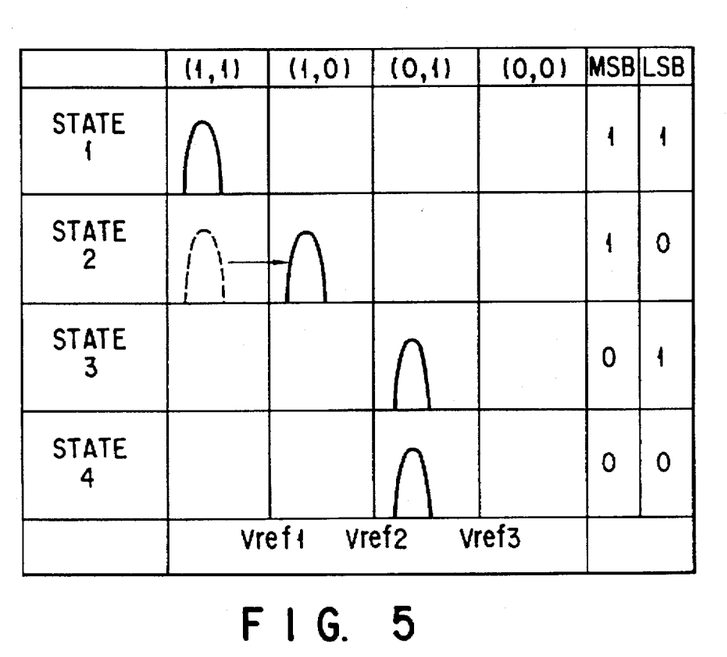
FIG. 5 is a diagram showing the distribution of the threshold voltages of memory cells after the LSB data writing operation is effected at the time of MSB="1"

In this case, the write operation for the memory cell of MSB=0, that is, the memory cell set in the state 3 or state 4 shown in FIG. 5 is inhibited.

As described before, LSB data is loaded in the sense amplifier LSEN. Data stored in the sense amplifier LSEN is transferred to the sense amplifier MSEN as it is. Thus, LSB data is latched in the sense amplifiers MSEN and LSEN. The data transfer (copy) is effected by turning OFF the transistors Q7, Q17 shown in FIG. 2 and turning ON the transistors Q13, Q16, Q6, Q3 (period tp4 shown in FIG. 8). Next, the transistor Q6 is turned OFF to electrically separate the sense amplifier MSEN from the sense amplifier LSEN and bit line (period tp5 shown in FIG. 8).

Figure 9:
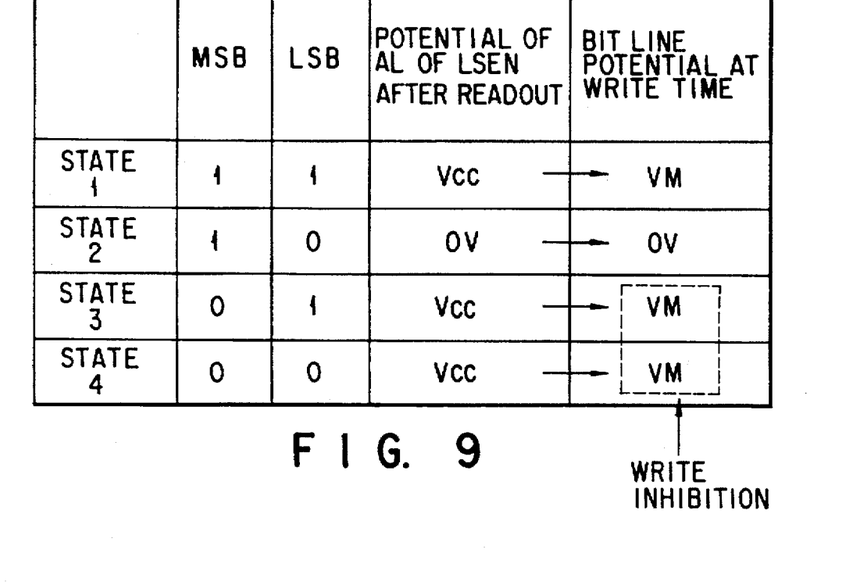
FIG. 9 is a diagram for illustrating the operation of the non-volatile semiconductor memory device of this invention.

After this, the transistors Q7 and Q16 are turned ON to electrically connect the bit line BLR and the sense amplifier LSEN together. Then, the potential of the control gate of the selected memory cell is set to the ground potential to read out MSB data written in the process (4-2-1) from the memory cell. When the readout MSB data is "0" or when the state 1 is set, the potential of the bit line after the readout is set to the power supply potential as shown in FIG. 9. Therefore, the write operation is inhibited irrespective of whether LSB data is "0" or "1". After this, if the write operation is effected, the potential of the bit line in the state 1, 3 or 4 is set to an intermediate potential VM, for example, Vpp/2=10 V (Vpp is a write voltage), and data is not written in the memory cell set in the state 1, 3 or 4 and data is written only in the memory cell set in the state 2 (period tp6 shown in FIG. 8). After completion of the write operation, the threshold voltage is verified by use of a voltage 0.2 V obtained by adding a margin of 0.2 V, for example, to the reference voltage Vref1 (period tp7 shown in FIG. 8).

(4-2-4) Write operation of LSB=1 in the case of MSB=0

In this case, the write operation for the memory cell of MSB=1 (the state 1 or 2 shown in FIG. 4) is inhibited. First, MSB data written in the process (4-2-1) is read out from the memory cell and the readout data is inverted and then latched into the sense amplifier LSEN. That is, in the normal readout operation, the signal LS1 is set to the high level to turn ON the transistor Q12. In contrast, in the case of readout operation in the inverted form, the signal LS2 is set to the high level to turn ON the transistor Q33 (periods tp8, tp9 shown in FIG. 8). MSB data thus read out in the inverted form is latched into the flip-flop FF2. Data latched in the flip-flop FF2 is transferred to the sense amplifier MSEN (periods tp8, tp9 shown in FIG. 8).

Figure 6:
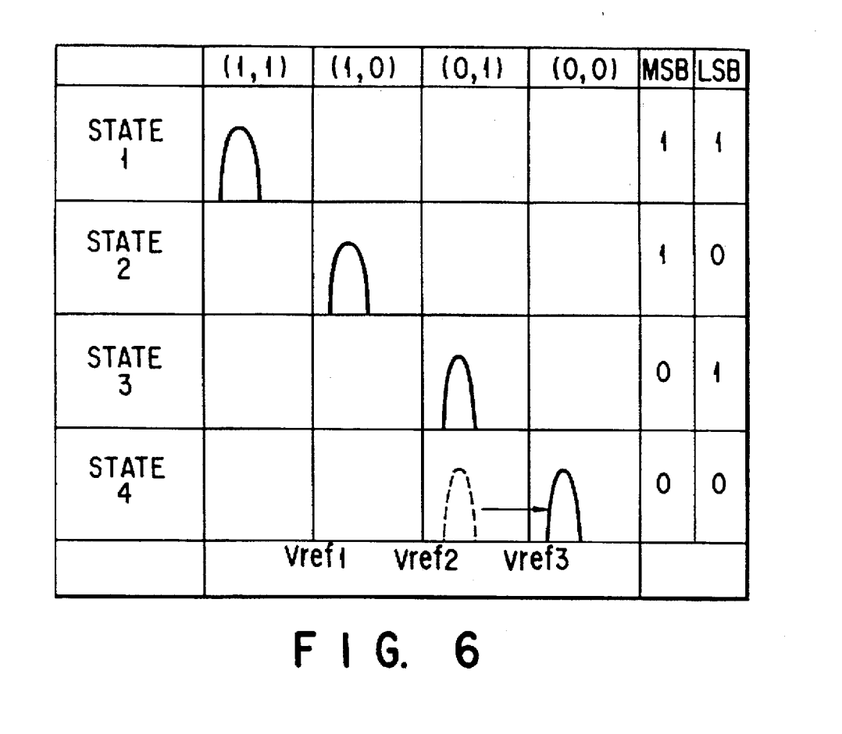
FIG. 6 is a diagram showing the distribution of the threshold voltages of memory cells after the LSB data writing operation is effected at the time of MSB="0"
Figure 10:
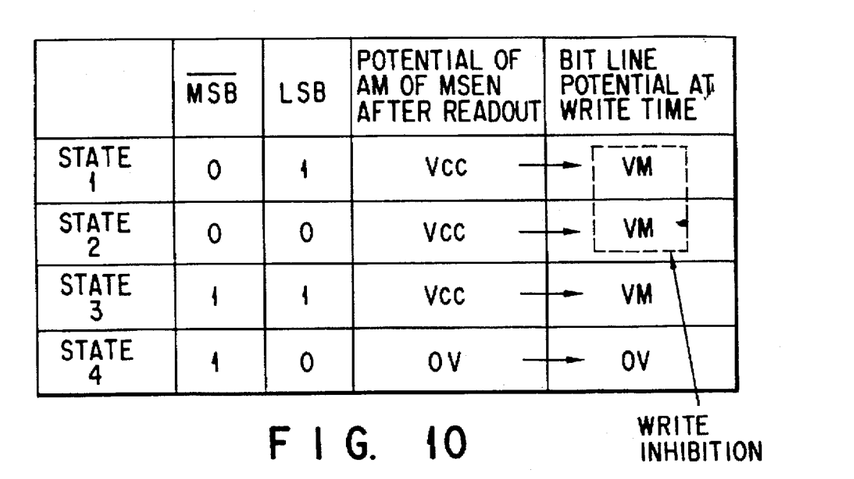
FIG. 10 is a diagram for illustrating the operation of the non-volatile semiconductor memory device of this invention.

In the sense amplifier MSEN, LSB data copied from the sense amplifier LSEN is latched. If MSB data is read out from the memory cell as it is, the potential of the node AM of the sense amplifier MSEN is set to a value as shown in FIG. 10, and the potential of the bit line for the memory cell set in the state 1, 2 or 3 is set to an intermediate potential VM at the time of writing to inhibit the writing operation. Therefore, data is written into only the memory cell set in the state 4 and the relation of the threshold voltage shown in FIG. 6 is obtained (period tp 11 shown in FIG. 8). After this, the threshold voltage is verified by use of a voltage 2.2 V obtained by adding a margin of 0.2 V, for example, to the reference voltage Vref3 (period tp12 shown in FIG. 8). Thus, 4-value (2-bit) data can be written into the selected memory cell by effecting one erasing process and repeatedly effecting three-stage write and verify processes. The period tp10 shown in FIG. 8 is a margin for latch in the sense amplifier LSEN.

Thus, by connecting the two sense amplifiers MSEN, LSEN to one bit line and effecting the data writing and readout operation by use of the sense amplifiers MSEN, LSEN, 2-bit data can be stored into one memory cell. Therefore, a non-volatile semiconductor memory device of large capacity can be constructed. Further, since the non-volatile semiconductor memory device can be manufactured by the same process as the normal manufacturing process, an increase in the manufacturing cost can be suppressed.

Further, since a ½-column selection system is used, the number of sense amplifiers can be set to substantially one for one bit line.

In addition, MSB data and LSB data are held in the first and second flip-flop circuits at the readout time and writing time as they are. For this reason, it is possible to transfer the MSB data and LSB data with respect to the input buffer and output buffer as they are. Therefore, it is not necessary to provide an additional circuit for processing data to be input or output and an increase in the scale of the circuit construction can be prevented.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A non-volatile semiconductor memory device comprising:

memory cells connected to bit lines, first and second data being stored in each of said memory cells;

a voltage generating circuit for generating a plurality of reference voltages of different levels and supplying the reference voltages to the gates of said memory cells at the time of data writing and data readout; and first and second storage circuits coupled to each of said bit lines, for holding first and second data to be written into one of said memory cells at the data writing time and holding first and second data read out from said memory cell according to the plurality of reference voltages at the data readout time.

2. A device according to claim 1, wherein each of said memory cells stores plural-bit data, the first data is lower-bit data, and the second data is upper-bit data.

3. A device according to claim 2, wherein said memory cells are arranged in NAND cell units.

4. A device according to claim 1, wherein each of said first and second storage circuits comprises a flip-flop circuit.

5. A device according to claim 2, further comprising a transfer circuit connected to said first and second storage circuits, for transferring the upper-bit data stored in said second storage circuit to said first storage circuit at the time of readout of the lower-bit data.

6. A non-volatile semiconductor memory device comprising:

memory cells connected to bit lines and each having a control gate and a floating gate, each of said memory cells having one of first, second, third and fourth threshold voltages which are set at different levels;

a voltage generating circuit for generating first, second and third reference voltages and for supplying one of the reference voltages to the control gates of said memory cells at the data readout time, the level of the first reference voltage being set between the first and second threshold voltages, the level of the second reference voltage being set between the second and third threshold voltages, and the level of the third reference voltage being set between the third and fourth threshold voltages; and first and second storage circuits coupled to each of said bit lines, said second storage circuit holding one of first data corresponding to the first or second threshold voltage which is lower than the second reference voltage and second data corresponding to the third or fourth threshold voltage which is higher than the second reference voltage at the data readout time, and said first storage circuit holding one of third data corresponding to the first threshold voltage which is lower than the first reference voltage, fourth data corresponding to the second threshold voltage which is higher than the first reference voltage, fifth data corresponding to the third threshold voltage which is lower than the third reference voltage, and sixth data corresponding to the fourth threshold voltage which is higher than the third reference voltage.

7. A device according to claim 6, wherein each of the first and second data is upper-bit data and each of the third to sixth data is lower-bit data.

8. A device according to claim 6, wherein said memory cells are arranged in NAND cell units.

9. A device according to claim 6, wherein each of said first and second storage circuits comprises a flip-flop circuit.

10. A device according to claim 6, further comprising a transfer circuit connected to said first and second storage circuits, for transferring the second data stored in said second storage circuit to said first storage circuit at the time of readout of the fifth, or sixth data.

11. A non-volatile semiconductor memory device comprising:

memory cells connected to bit lines and each having a control gate and a floating gate, each of said memory cells having one of first, second, third and fourth threshold voltages which are set at different levels;

a voltage generating circuit for generating first, second and third reference voltages and for supplying one of the reference voltages to the control gates of said memory cells at the data writing time, the level of the first reference voltage being set between the first and second threshold voltages, the level of the second reference voltage being set between the second and third threshold voltages, and the level of the third reference voltage being set between the third and fourth threshold voltages; and first and second storage circuits coupled to each of said bit lines, said second storage circuit holding one of first data corresponding to the first or second threshold voltage which is lower than the second reference voltage and second data corresponding to the third or fourth threshold voltage which is higher than the second reference voltage at the data writing time, and said first storage circuit holding one of third data corresponding to the first threshold voltage which is lower than the first reference voltage, fourth data corresponding to the second threshold voltage which is higher than the first reference voltage, fifth data corresponding to the third threshold voltage which is lower than the third reference voltage, and sixth data corresponding to the fourth threshold voltage which is higher than the third reference voltage;

wherein the first data held in said second storage circuit is written into one of the memory cells with the second reference voltage used as a reference voltage to set the threshold voltage of said memory cell equal to the first threshold voltage, the second data held in said second storage circuit is written into the memory cell with the second reference voltage used as a reference voltage to set the threshold voltage of said memory cell equal to the third threshold voltage, the third data held in said first storage circuit is written into the memory cell with the first reference voltage used as a reference voltage to set the threshold voltage of said memory cell equal to the first threshold voltage, the fourth data held in said first storage circuit is written into the memory cell with the first reference voltage used as a reference voltage to set the threshold voltage of said memory cell equal to the second threshold voltage, the fifth data held in said first storage circuit is written into the memory cell with the third reference voltage used as a reference voltage to set the threshold voltage of said memory cell equal to the third threshold voltage, and the sixth data held in said first storage circuit is written into the memory cell with the third reference voltage used as a reference voltage to set the threshold voltage of said memory cell equal to the fourth threshold voltage.

12. A device according to claim 11, wherein each of the first and second data items is upper-bit data and each of the third to sixth data items is lower-bit data.

13. A device according to claim 11, wherein said memory cells are arranged in NAND cell units.

14. A device according to claim 11, wherein each of said first and second storage circuits comprises a flip-flop circuit.

15. A device according to claim 11, further comprising a transfer circuit connected to said first and second storage circuits, for transferring the fourth data stored in said first storage circuit to said second storage circuit at the time of writing of the fourth data.

16. A device according to claim 11, further comprising an inverting type reading circuit connected to said first storage circuit and said bit line, for reading out data stored in the memory cell, inverting the readout data and then storing the inverted readout data into said first storage circuit.

17. A non-volatile semiconductor memory device comprising:
   memory cells connected to bit lines and each having a control gate and a floating gate, each of said memory cells having one of first, second, third and fourth threshold voltages which are set at different levels;
   a first storage circuit coupled to each of said bit lines;
   a second storage circuit coupled to each of said bit lines; and
   a voltage generating circuit for generating first, second and third reference voltages and for supplying one of the reference voltages to the control gates of said memory cells, the level of the first reference voltage being set between the first and second threshold voltages, the level of the second reference voltage being set between the second and third threshold voltages, and the level of the third reference voltage being set between the third and fourth threshold voltages;
   wherein said first storage circuit detects whether one of the first to fourth threshold voltages read out from the memory cell is lower or higher than the second reference voltage, holds the result of detection, said second storage circuit detects whether the readout threshold voltage is lower or higher than the first reference voltage when the readout threshold voltage is lower than the second reference voltage and holds the result of detection, and detects whether the readout threshold voltage is lower or higher than the third reference voltage when the readout threshold voltage is higher than the second reference voltage and holds the result of detection.

18. A device according to claim 17, wherein said memory cells are arranged in NAND cell units.

19. A device according to claim 17, wherein each of said first and second storage circuits comprises a flip-flop circuit.

20. A device according to claim 17, further comprising a transfer circuit connected to said first and second storage circuits, for transferring the second data stored in said second storage circuit to said first storage circuit at the time of readout of the fifth and sixth data.

21. A device according to claim 17, further comprising transfer circuits respectively connected to said first and second storage circuits, for respectively transferring data held in said first and second storage circuits to a data line.

22. A readout method for reading out data from a memory cell in which one of first, second, third and fourth threshold voltages whose levels are set in the ascending order is set, comprising the steps of:
   storing first data into a first storing circuit when a voltage read out from the memory cell to a bit line corresponds to the first or second threshold voltage which is lower than the second reference voltage and storing second data into said first storing circuit when a voltage read out from the memory cell to the bit line corresponds to the third or fourth threshold voltage which is higher than the second reference voltage; and
   storing third data into a second storing circuit when a threshold voltage read out from the memory cell to the bit line corresponds to the first threshold voltage which is lower than the first reference voltage, storing fourth data into said second storing circuit when a threshold voltage read out from the memory cell to the bit line corresponds to the second threshold voltage which is higher than the first reference voltage, storing fifth data into said second storing circuit when a threshold voltage read out from the memory cell to the bit line corresponds to the third threshold voltage which is lower than the third reference voltage, and storing sixth data into said second storing circuit when a threshold voltage read out from the memory cell to the bit line corresponds to the fourth threshold voltage which is higher than the third reference voltage.

23. A method according to claim 22, wherein each of the first and second data items is upper-bit data, each of the third to sixth data items is lower-bit data, and the lower-bit data is read out after the upper-bit data is read out at the data readout time.

24. A data writing method for writing one of first, second, third and fourth threshold voltages whose levels are set in the ascending order is set into a memory cell, comprising the steps of:
   holding one of first data corresponding to the first or second threshold voltage and second data corresponding to the third or fourth threshold voltage in a second storage circuit;
   holding one of third data corresponding to the first threshold voltage, fourth data corresponding to the second threshold voltage, fifth data corresponding to the third threshold voltage, and sixth data corresponding to the fourth threshold voltage in a first storage circuit; and
   generating one of first, second and third reference voltages and supplying the reference voltage to the gate of the memory cell, the level of the first reference voltage being set between the first and second threshold voltages, the level of the second reference voltage being set between the second and third threshold voltages, and the level of the third reference voltage being set between the third and fourth threshold voltages;
   wherein the first data held in the first storage circuit is written into the memory cell with the second reference voltage used as a reference voltage to set the threshold voltage of the memory cell equal to the first threshold voltage, the second data held in the first storage circuit is written into the memory cell with the second reference voltage used as a reference voltage to set the threshold voltage of said memory cell equal to the third threshold voltage, the third data held in the second storage circuit is written into the memory cell with the first reference voltage used as a reference voltage to set the threshold voltage of the memory cell equal to the first threshold voltage, the fourth data held in the second storage circuit is written into the memory cell with the first reference voltage used as a reference voltage to set the threshold voltage of the memory cell equal to the second threshold voltage, the fifth data held in the second storage circuit is written into the memory cell with the third reference voltage used as a reference voltage to set the threshold voltage of the memory cell equal to the third threshold voltage, and the sixth data held in the second storage circuit is written into the memory cell with the third reference voltage used as a reference voltage to set the threshold voltage of the memory cell equal to the fourth threshold voltage.

25. A method according to claim 24, wherein each of the first and second data items is upper-bit data, each of the third to sixth data items is lower-bit data, and the lower-bit data is written after the upper-bit data is written at the data writing time.

26. A non-volatile semiconductor memory device, comprising:

memory cells connected to a bit line, each memory cell storing multi-bit data;

selecting circuitry for selecting a memory cell; and first and second storing circuits connected to said bit line, said first storing circuit storing a first bit of the multi-bit data of the selected memory cell at a read-out time and a writing time and said second storing circuit storing a second bit of the multi-bit data of the selected memory cell at the read-out time and the writing time.

27. A device according to claim 26, further comprising:

a transfer circuit for selectively transferring data between said first and second storage circuits.

28. A device according to claim 27, wherein said transfer circuit comprises:

a first transistor having a first end coupled to said first storing circuit and a gate supplied with a first signal;

a second transistor having a first end coupled to a second end of said first transistor, a second end coupled to a predetermined potential, and a gate supplied with a second signal; and a third transistor having a first end coupled to said second storing circuit, a second end coupled to the predetermined potential, and a gate coupled to a node between said first and second transistors.

29. A device according to claim 26, wherein each of said first and second storing circuits comprises a flip-flop circuit.

30. A device according to claim 26, wherein said memory cells are arranged in NAND cell units.

31. A device according to claim 26, wherein said multi-bit data is 2-bit data.

32. A non-volatile semiconductor memory device, comprising:

first memory cells connected to a first bit line, each first memory cell storing multi-bit data; second memory cells connected to a second bit line, each second memory cell storing multi-bit data;

selecting circuitry for selecting one of said first and second memory cells; and first and second storing circuits connected to said first bit line and to said second bit line, said first storing circuit storing a first bit of the multi-bit data of the selected memory cell at a read-out time and a writing time and said second storing circuit storing a second bit of the multi-bit data of the selected memory cell at the read-out time and the writing time.

33. A device according to claim 32, further comprising:

a transfer circuit for selectively transferring data between said first and second storing circuits.

34. A device according to claim 33, wherein said transfer circuit comprises:

a first transistor having a first end coupled to said first storing circuit and a gate supplied with a first signal;

a second transistor having a first end coupled to a second end of said first transistor, a second end coupled to a predetermined potential, and a gate supplied with a second signal; and a third transistor having a first end coupled to said second storing circuit, a second end coupled to the predetermined potential, and a gate coupled to a node between said first and second transistors.

35. A device according to claim 32, wherein each of said first and second storing circuits comprises a flip-flop circuit.

36. A device according to claim 32, wherein said first and said second memory cells are arranged in NAND cell units.

37. A device according to claim 32, further comprising:

a first selecting transistor coupled between said first bit line and said first and second sense amplifiers; and a second selecting transistor coupled between said second bit line and said first and second sense amplifiers.

38. A non-volatile semiconductor memory device, comprising:

memory cells connected to a bit line;

selecting circuitry for selecting said memory cells;

first and second sense amplifiers coupled to said bit line, said first sense amplifier comprising a first storing circuit and said second sense amplifier comprising a second storing circuit; and a transfer circuit for selectively transferring data between said first storing circuit and said second storing circuit.

39. A device according to claim 38, wherein said transfer circuit comprises:

a first transistor having a first end coupled to said first storing circuit and a gate supplied with a first signal;

a second transistor having a first end coupled to a second end of said first transistor, a second end coupled to a predetermined potential, and a gate supplied with a second signal; and a third transistor having a first end coupled to said second storing circuit, a second end coupled to the predetermined potential, and a gate coupled to a node between said first and second transistors.

40. A device according to claim 38, wherein said memory cells are arranged in NAND cell units.

* * * * *